United States Patent
Bathan et al.

(10) Patent No.: US 8,273,602 B2
(45) Date of Patent: Sep. 25, 2012

(54) INTEGRATED CIRCUIT PACKAGE SYSTEM WITH INTEGRATION PORT

(75) Inventors: Henry Descalzo Bathan, Singapore (SG); Lionel Chien Hui Tay, Singapore (SG); Zigmund Ramirez Camacho, Singapore (SG); Jose Alvin Caparas, Singapore (SG)

(73) Assignee: Stats Chippac Ltd., Singapore (SG)

( * ) Notice: Subject to any disclaimer, the term of this patent is extended or adjusted under 35 U.S.C. 154(b) by 488 days.

(21) Appl. No.: 12/046,430

(22) Filed: Mar. 11, 2008

(65) Prior Publication Data

US 2009/0230517 A1 Sep. 17, 2009

(51) Int. Cl.
*H01L 21/00* (2006.01)
(52) U.S. Cl. . 438/109; 257/686; 257/687; 257/E23.001; 438/107; 438/108; 438/127
(58) Field of Classification Search .................. 257/676, 257/680; 438/107, 109, 686
See application file for complete search history.

(56) References Cited

U.S. PATENT DOCUMENTS

| | | | | |
|---|---|---|---|---|
| 5,381,039 A | * | 1/1995 | Morrison | 257/701 |
| 6,690,088 B2 | | 2/2004 | MacIntyre | |
| 6,977,431 B1 | | 12/2005 | Oh et al. | |
| 7,045,396 B2 | | 5/2006 | Crowley et al. | |
| 7,312,519 B2 | | 12/2007 | Song et al. | |
| 2004/0145039 A1 | * | 7/2004 | Shim et al. | 257/678 |
| 2006/0180904 A1 | * | 8/2006 | Ong | 257/676 |
| 2006/0249839 A1 | * | 11/2006 | Yoshida | 257/723 |
| 2007/0096160 A1 | * | 5/2007 | Beroz et al. | 257/232 |
| 2007/0200257 A1 | | 8/2007 | Chow et al. | |

* cited by examiner

*Primary Examiner* — Marcos D. Pizarro
*Assistant Examiner* — Eva Yan Montalvo
(74) *Attorney, Agent, or Firm* — Ishimaru & Associates LLP; Mikio Ishimaru; Stanley M. Chang

(57) ABSTRACT

An integrated circuit package system comprising: fabricating a package base including: forming a lead frame, coupling a first integrated circuit device under the lead frame, coupling a second integrated circuit device over the first integrated circuit device, and molding an enclosure on the lead frame, the first integrated circuit device, and the second integrated circuit device for forming an integration port; and coupling a third integrated circuit device on the integration port.

20 Claims, 8 Drawing Sheets

INTEGRATED CIRCUIT PACKAGE SYSTEM WITH INTEGRATION PORT

TECHNICAL FIELD

The present invention relates generally to integrated circuit packaging, and more particularly to a system for stacking integrated circuit modules the have been previously tested.

BACKGROUND ART

Modern consumer electronics, such as smart phones, personal digital assistants, and location based services devices, as well as enterprise electronics, such as servers and storage arrays, are packing more integrated circuits into an ever shrinking physical space with expectations for decreasing cost. Numerous technologies have been developed to meet these requirements. Some of the research and development strategies focus on new package technologies while others focus on improving the existing and mature package technologies. Research and development in the existing package technologies may take a myriad of different directions.

One proven way to reduce cost is to use package technologies with existing manufacturing methods and equipments. Paradoxically, the reuse of existing manufacturing processes does not typically result in the reduction of package dimensions. Existing packaging technologies struggle to cost effectively meet the ever demanding integration of today's integrated circuits and packages.

In response to the demands for improved packaging, many innovative package designs have been conceived and brought to market. The multi-chip module has achieved a prominent role in reducing the board space. Numerous package approaches stack multiple integrated circuit, package level stacking, or package-on-package (POP). Known-good-die (KGD) and assembly process yields are not an issue since each package can be tested prior to assembly, allowing KGD to be used in assembling the stack. But stacking integrated devices, package-in-package, or combination thereof have system level difficulties.

There is a demand for module packages and package stacks that are able to integrate multiple components and sub-modules, which are pre-tested to minimize occurrence of gross component failure. A component may be discarded when defective (untested) components are blindly integrated with other devices within a system in package (SiP). Various methods have been proposed such as existing methods for package-in-package (PIP) or POP, but most come with limitations in number of components and lack the flexibility to package many different components.

Thus, a need still remains for the integrated circuit package system providing low cost manufacturing as well as flexibility for different stacking configurations, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: fabricating a package base including: forming a lead frame, coupling a first integrated circuit device under the lead frame, coupling a second integrated circuit device over the first integrated circuit device, and molding an enclosure on the lead frame, the first integrated circuit device, and the second integrated circuit device for forming an integration port; and coupling a third integrated circuit device on the integration port.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
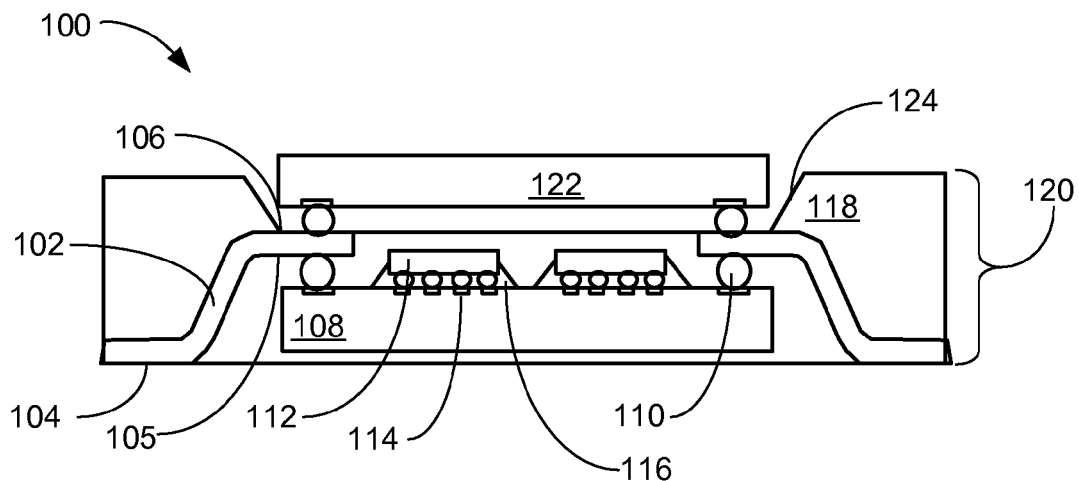
FIG. 1 is a cross-sectional view of an integrated circuit package system with integration port, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the coplanar contacts, regardless of their orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package system 100 with integration port, in an embodiment of the present invention. The cross-sectional view of the integrated circuit package system 100 depicts a lead frame 102 having coplanar contacts 104 and integration contacts 106. A first integrated circuit device 108, such as a ball grid array, a wafer level chip scale package, a system in package, a quad flat pack no-lead, a quad flat pack, a small outline package, packaged discrete components, or a flip chip integrated circuit, may be coupled to a bottom side 105 of the integration contacts 106 by a chip interconnect 110.

A second integrated circuit device 112 may be coupled to an interface pad 114 on the first integrated circuit device 108 by the chip interconnect 110, such as a solder ball, a solder column, a solder bump, or a stud bump. The second integrated circuit device 112 may optionally be an integrated circuit die mounted with the active side toward the interface pad 114. In this case an underfill 116 may be applied to protect the integrated circuit die.

An enclosure 118, such as an epoxy molding compound, may be formed on the lead frame 102, the first integrated circuit device 108 and the second integrated circuit device 112. The integration contacts 106 and the coplanar contacts 104 remain exposed from the enclosure 118. The combination of the lead frame 102, the first integrated circuit device 108, the second integrated circuit device 112 and the enclosure 118 may form a package base 120.

A third integrated circuit device 122, such as a ball grid array, a wafer level chip scale package, a system in package, a quad flat pack no-lead, a quad flat pack, a small outline package, packaged discrete components, or a flip chip integrated circuit, may be positioned over the package base 120 and coupled to the integration contacts 106 by the chip interconnect 110.

The package base 120 of FIG. 1 may have more than one of the second integrated circuit device 112. This is presented by way of an example in FIG. 1. While it is understood that the multiple occurrences of the second integrated circuit device 112 may be substantially similar, they may also be different in size, function, or type. It is further understood that a recess wall 124 may be optional and the package base 120 may have a flat surface that is coplanar with the integration contacts 106.

Figure 2:
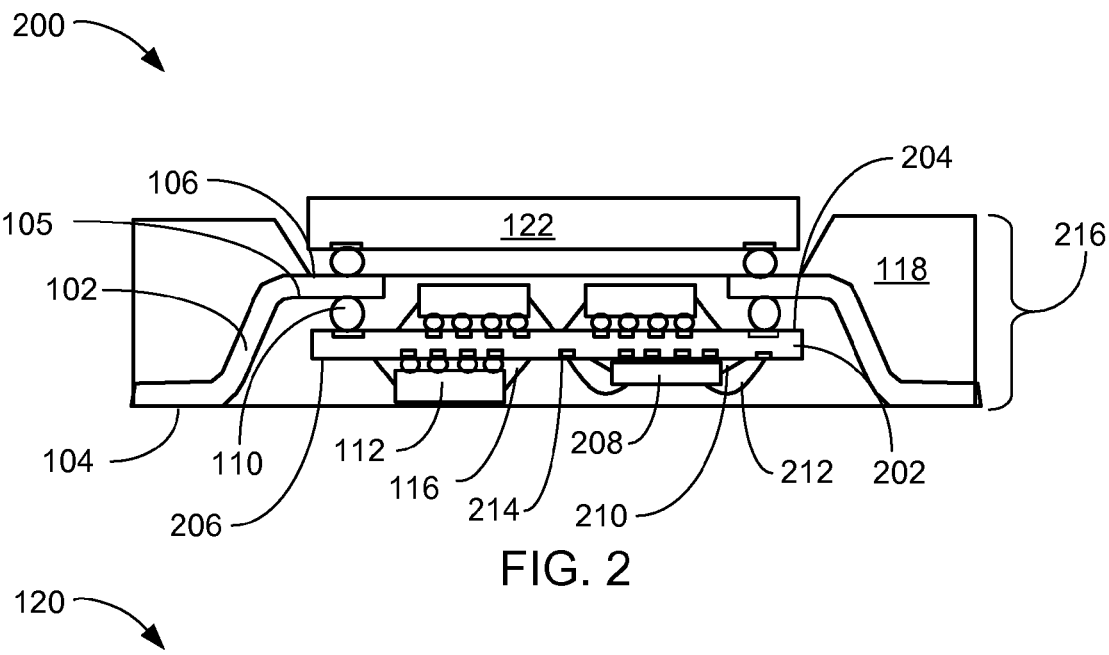
FIG. 2 is a cross-sectional view of an integrated circuit package system with integration port, in a first alternative embodiment of the present invention.

Referring now to FIG. 2, therein is shown a cross-sectional view of an integrated circuit package system 200 with integration port, in a first alternative embodiment of the present invention. The cross-sectional view of the integrated circuit package system 200 depicts the lead frame 102 having the coplanar contacts 104 and the integration contacts 106. A substrate 202, such as a laminate printed circuit board, a ceramic substrate, or a redistribution layer, may be coupled to the bottom side 105 of the integration contacts 106 by the chip interconnects 110. The substrate 202 may have a substrate top 204 and a substrate bottom 206.

An integrated circuit die 208 may be mounted on the substrate bottom 206 by an adhesive 210, such as a die attach material. Electrical interconnects 212, such as bond wires, may couple the integrated circuit die 208 to distribution contacts 214. As an example, a unit of the second integrated circuit device 112 may be coupled to the distribution contacts 214 on the substrate bottom 206. The second integrated circuit device 112 may be the ball grid array, the wafer level chip scale package, the system in package, the quad flat pack no-lead, the quad flat pack, the small outline package, the packaged discrete components, or the flip chip integrated circuit. The underfill 116 may optionally be applied on the chip interconnects 110 between the second integrated circuit device 112 and the distribution contacts 214.

Additional units of the second integrated circuit device 112 may be coupled to the substrate top 204 in substantially similar fashion as the second integrated circuit device 112 mounted on the substrate bottom 206. While it is understood that the multiple occurrences of the second integrated circuit device 112 may be substantially similar, they may also be different in size, function, or type. It is also by way of an example to show two instances of the second integrated circuit 112 mounted on the substrate top 204 and in actual implementation there may be a different number of instances.

The enclosure 118, such as an epoxy molding compound, may be formed on the lead frame 102, the substrate 202, the integrated circuit die 208, the second integrated circuit device 112, the chip interconnects 110, and the electrical interconnects 212. The integration contacts 106 and the coplanar contacts 104 remain exposed from the enclosure 118. The combination of the lead frame 102, the substrate 202, the integrated circuit die 208, the second integrated circuit device 112 and the enclosure 118 may form the package base 120.

The third integrated circuit device 122, such as the ball grid array, the wafer level chip scale package, the system in package, the quad flat pack no-lead, the quad flat pack, the small outline package, the packaged discrete components, or the flip chip integrated circuit, may be positioned over a package base 216 and coupled to the integration contacts 106 by the chip interconnect 110.

Figure 3:
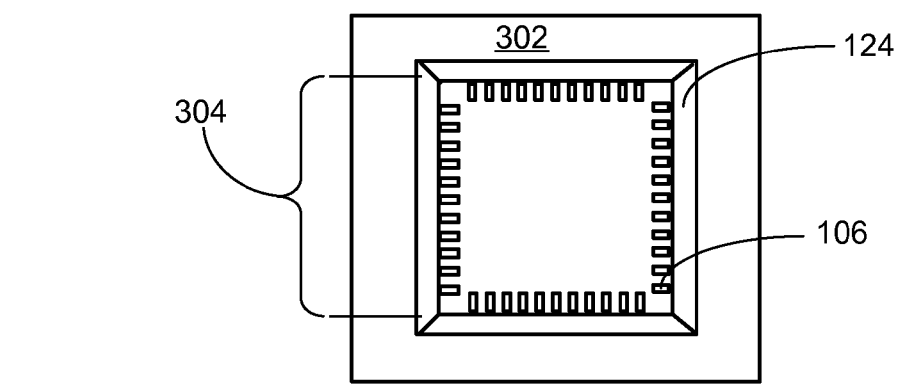
FIG. 3 is a top view of the package base of the integrated circuit package system of FIG. 1.

Referring now to FIG. 3, therein is shown a top view of the package base 120 of the integrated circuit package system 100 of FIG. 1. The top view of the package base 120 depicts a flat surface 302 having the recess wall 124 optionally positioned around an integration port 304 comprised of the integration contacts 106.

The number and orientation of the integration contacts 106 that make-up the integration port is by way of an example only. The number and relative position of the integration contacts 106 may differ. The recess wall 124 may be optional. The actual implementation may optionally have the flat surface 302 coplanar with the integration contacts 106.

Figure 4:
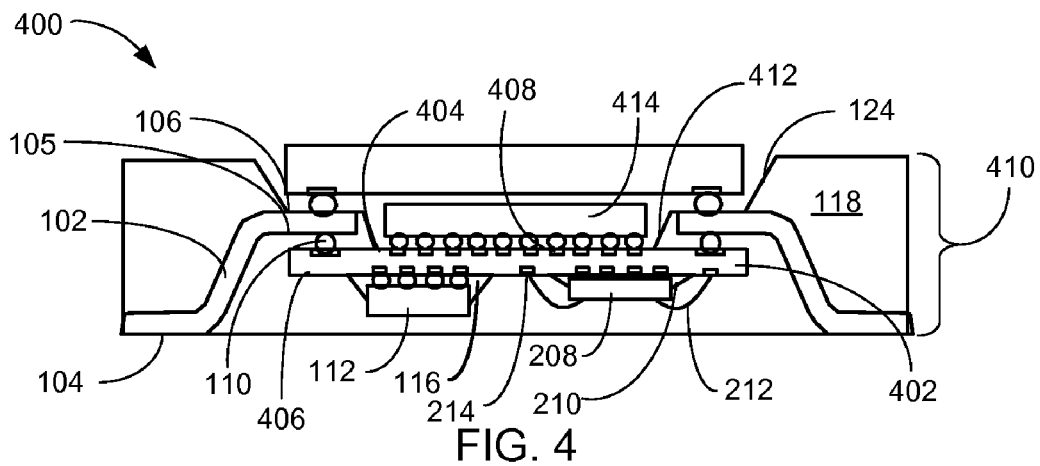
FIG. 4 is a cross-sectional view of an integrated circuit package system with integration port, in a second alternative embodiment of the present invention.

Referring now to FIG. 4, therein is shown a cross-sectional view of an integrated circuit package system 400 with integration port, in a second alternative embodiment of the present invention. The cross-sectional view of the integrated circuit package system 400 depicts the lead frame 102 having the coplanar contacts 104 and the integration contacts 106. An extended integration substrate 402, such as a laminate printed circuit board, a ceramic substrate, or a redistribution layer, may be coupled to the bottom side 105 of the integration contacts 106 by the chip interconnects 110. The extended integration substrate 402 may have a substrate top 404 and a substrate bottom 406.

The integrated circuit die 208 may be mounted on the substrate bottom 406 by the adhesive 210, such as a die attach material. The electrical interconnects 212, such as bond wires, may couple the integrated circuit die 208 to the distribution contacts 214. As an example, a unit of the second integrated circuit device 112 may be coupled to the distribution contacts 214 on the substrate bottom 206. The second integrated circuit device 112 may be the ball grid array, the wafer level chip scale package, the system in package, the quad flat pack no-lead, the quad flat pack, the small outline package, the packaged discrete components, or the flip chip integrated circuit. The underfill 116 may optionally be applied on the chip interconnects 110 between the second integrated circuit device 112 and the distribution contacts 214.

The substrate top 404 may have extended integration contacts 408. The enclosure 118, such as an epoxy molding compound, may be formed on the lead frame 102, the extended integration substrate 402, the integrated circuit die 208, the second integrated circuit device 112, the chip interconnects 110, and the electrical interconnects 212. The integration contacts 106, the coplanar contacts 104, and a portion of the substrate top 404 remain exposed from the enclosure 118. The combination of the lead frame 102, the substrate 202, the integrated circuit die 208, the second integrated circuit device 112 and the enclosure 118 may form a package base 410. The package base 410 may have an extended recess wall 412. The extended recess wall 412 may extend down to the extended integration substrate 402 providing access to the extended integration contacts 408.

A fourth integrated circuit device 414, such as a ball grid array, a quad flat pack, a small outline package, a quad flat pack no-lead, or the like, may be mounted over the package base 410 and electrically coupled to the extended integration contacts 408 by the chip interconnects 110. This configuration may provide additional space required for mounting a larger package as the fourth integrated circuit device 414.

The third integrated circuit device 122, such as a ball grid array, a wafer level chip scale package, a system in package, a quad flat pack no-lead, a quad flat pack, a small outline package, packaged discrete components, or a flip chip integrated circuit, may be positioned over the package base 410 and coupled to the integration contacts 106 by the chip interconnect 110.

This configuration is an example only and the fourth integrated circuit device 414 may be replaced by discrete components (not shown), such as resistors, inductors, capacitors, diodes, or the like. It has been discovered that the package base 410 may provide a highly flexible and reliable structure. As each of the active components may be tested prior to assembly, this configuration may also provide very good manufacturing yield.

Figure 5:
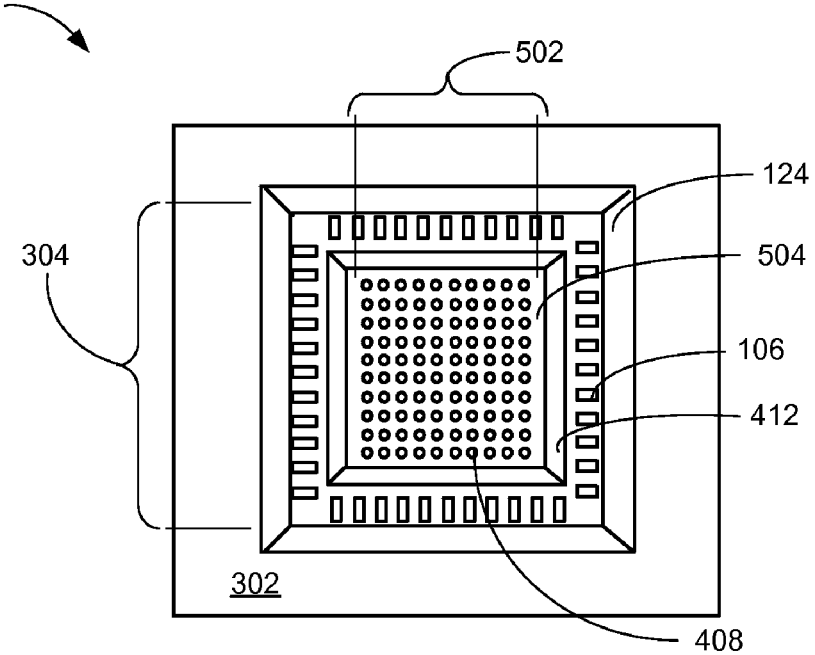
FIG. 5 is a top view of the package base of FIG. 4.

Referring now to FIG. 5, therein is shown a top view of the package base 410 of FIG. 4. The top view of the package base 410 depicts the flat surface 302 having the recess wall 124 optionally positioned around the integration port 304 comprised of the integration contacts 106.

The number and orientation of the integration contacts 106 that make-up the integration port is by way of an example only. The number and relative position of the integration contacts 106 may differ. The recess wall 124 may be optional. The actual implementation may optionally have the flat surface 302 coplanar with the integration contacts 106.

The extended recess wall 412 may provide access to an extended access port 502 made up of an array of the extended integration contacts 408 within an extended integration recess 504. The number and position of the extended integration contacts 408 in the extended access port 502 is by way of an example and the actual number and position of the extended integration contacts 408 may differ.

Figure 6:
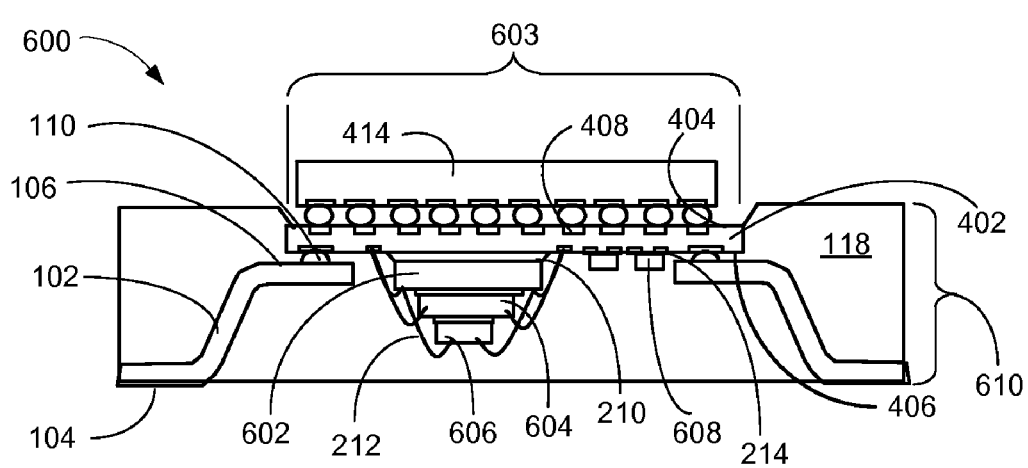
FIG. 6 is a cross-sectional view of an integrated circuit package system with integration port, in a third alternative embodiment of the present invention.

Referring now to FIG. 6, therein is shown a cross-sectional view of an integrated circuit package system 600 with integration port, in a third alternative embodiment of the present invention. The cross-sectional view of the integrated circuit package system 600 depicts the lead frame 102 having the coplanar contacts 104 and the integration contacts 106. The extended integration substrate 402, such as a laminate printed circuit board, a ceramic substrate, or a redistribution layer, may be coupled to the integration contacts 106 by the chip interconnects 110. The chip interconnects 110 are vertically extended between the extended integration substrate 402 and the lead frame 102. The extended integration substrate 402 may have the substrate top 404 and the substrate bottom 406. An integration port 603 can be fully above the lead frame 102.

A first stacked die 602 may be mounted on the substrate bottom 406 by the adhesive 210. The adhesive 210 fully covers a side of the first stacked die 602 attached to and facing the substrate bottom 406. A second stacked die 604 may be mounted on the active side of the first stacked die 602 by the adhesive 210. A third stacked die 606 may be mounted on the active side of the second stacked die 604. The electrical interconnects 212 may electrically connect the first stacked die 602, the second stacked die 604, the third stacked die 606, the substrate bottom 406, or a combination thereof. Having the first stacked die 602, the second stacked die 604, and the third stacked die 606 is an example only and any number of stacked dice may be used and electrically connected to the substrate bottom.

Discrete components 608, such as resistors, inductors, capacitors, diodes, or the like, may be connected to the distribution contacts 214 on the substrate bottom 406. The enclosure 118, such as an epoxy molding compound, may be formed on the lead frame 102, the extended integration substrate 402, the first stacked die 602, the second stacked die 604, the third stacked die 606, the discrete components 608, the chip interconnects 110, and the electrical interconnects 212 to form a package base 610. The substrate top 404 and the extended integration contacts 408 may remain exposed while the integration contacts 106 are enclosed. The integration port 603 above the lead frame 102 can be within the outermost horizontal and vertical edges of the enclosure 118. The integration port 603 can be exposed from the enclosure 118.

The fourth integrated circuit device 414, such as a ball grid array, a quad flat pack, a small outline package, a quad flat pack no-lead, or the like, may be mounted over the package base 610 and electrically coupled to the extended integration contacts 408 by the chip interconnects 110. This configuration may provide additional space required for mounting a larger package as the fourth integrated circuit device 414.

Figure 7:
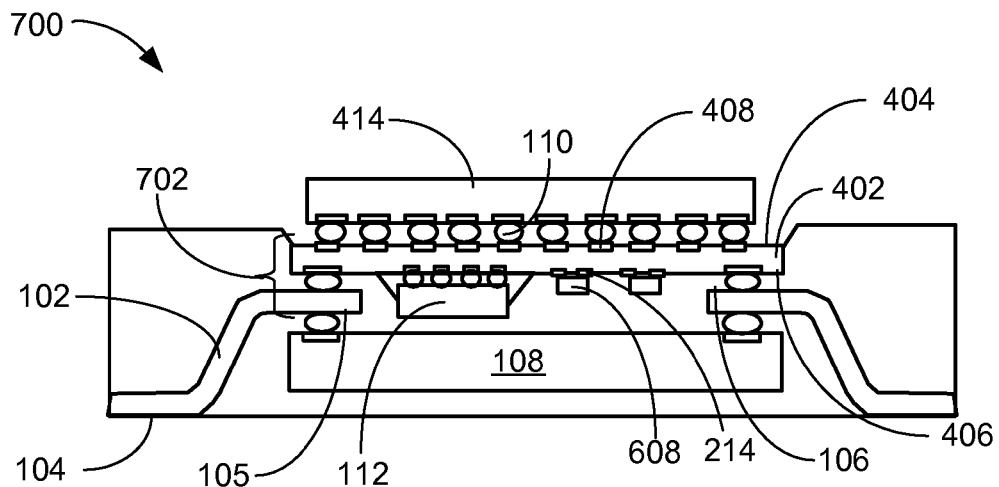
FIG. 7 is a cross-sectional view of an integrated circuit package system with integration port, in a fourth alternative embodiment of the present invention.

Referring now to FIG. 7, therein is shown a cross-sectional view of an integrated circuit package system 700 with integration port, in a fourth alternative embodiment of the present invention. The cross-sectional view of the integrated circuit package system 700 depicts the lead frame 102 having the first integrated circuit device 108 coupled to the bottom side 105 of the integration contacts 106 by the chip interconnect 110.

The extended integration substrate 402, such as a laminate printed circuit board, a ceramic substrate, or a redistribution layer, may be coupled to the integration contacts 106 by the chip interconnects 110. The extended integration substrate 402 may have the substrate top 404 and the substrate bottom 406. The second integrated circuit device 112 and the discrete components 608 may be coupled to the distribution contacts 214 on the substrate bottom 406.

An integration assembly 702 may include the extended integration substrate 402 having the second integrated circuit device 112, the discrete components 608, or a combination thereof mounted on the substrate bottom 406. The fourth integrated circuit device 414, such as a ball grid array, a quad flat pack, a small outline package, a quad flat pack no-lead, or the like, may be coupled to the extended integration contacts 408 by the chip interconnects 110.

Figure 8:
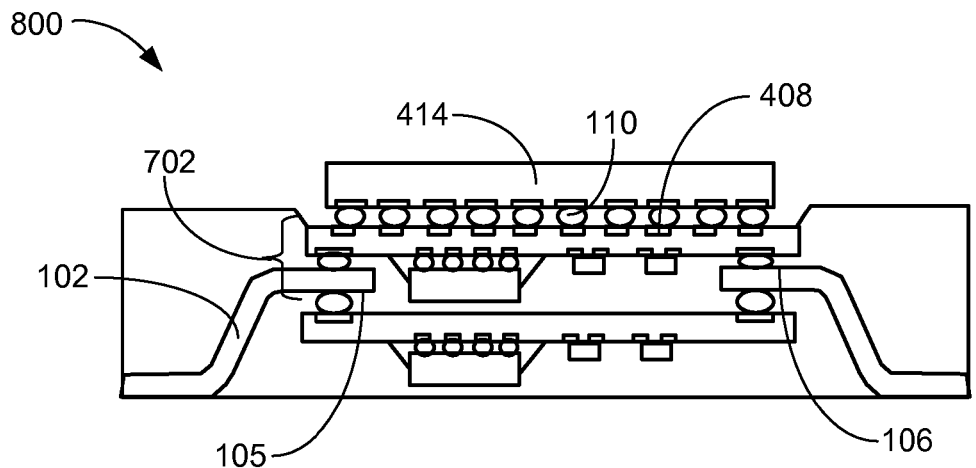
FIG. 8 is a cross-sectional view of an integrated circuit package system with integration port, in a fifth alternative embodiment of the present invention.

Referring now to FIG. 8, therein is shown a cross-sectional view of an integrated circuit package system 800 with integration port, in a fifth alternative embodiment of the present invention. The cross-sectional view of the integrated circuit package system 800 depicts the lead frame 102 having the integration assembly 702 mounted on the bottom side 105 of the integration contacts 106 by the chip interconnect 110. An additional unit of the integration assembly 702 may be coupled to the integration contacts 106.

The fourth integrated circuit device 414, such as a ball grid array, a quad flat pack, a small outline package, a quad flat pack no-lead, or the like, may be coupled to the extended integration contacts 408 by the chip interconnects 110.

Figure 9:
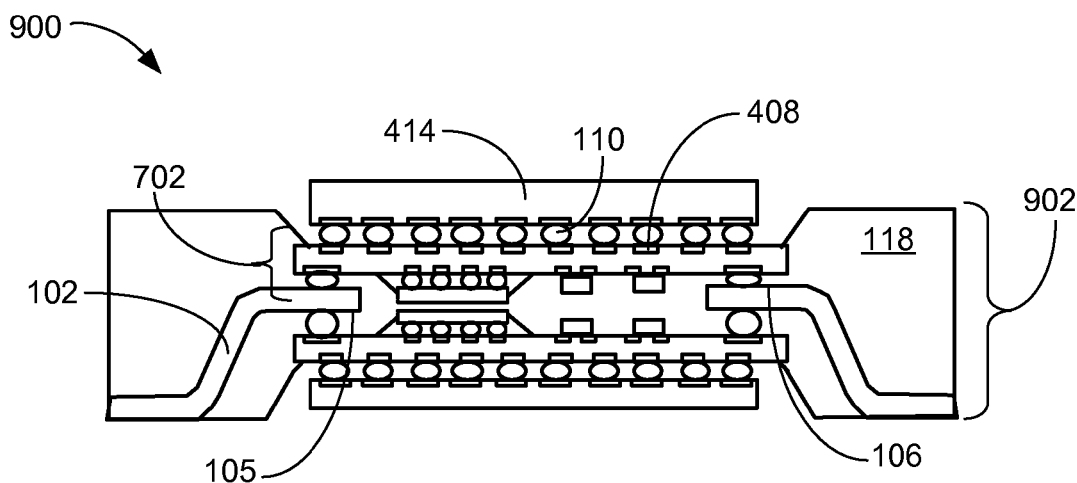
FIG. 9 is a cross-sectional view of an integrated circuit package system with integration port, in a sixth alternative embodiment of the present invention.

Referring now to FIG. 9, therein is shown a cross-sectional view of an integrated circuit package system 900 with integration port, in a sixth alternative embodiment of the present invention. The cross-sectional view of the integrated circuit package system 900 depicts the lead frame 102 having the integration assembly 702 mounted on the bottom side 105 of the integration contacts 106 by the chip interconnect 110. An additional unit of the integration assembly 702 may be coupled to the integration contacts 106.

In this configuration, the enclosure 118 may form a recess on the top and bottom of a package base 902. The fourth integrated circuit device 414, such as a ball grid array, a quad flat pack, a small outline package, a quad flat pack no-lead, or the like, may be coupled to the extended integration contacts 408 by the chip interconnects 110 on both the top and bottom of the package base 902.

Figure 10:
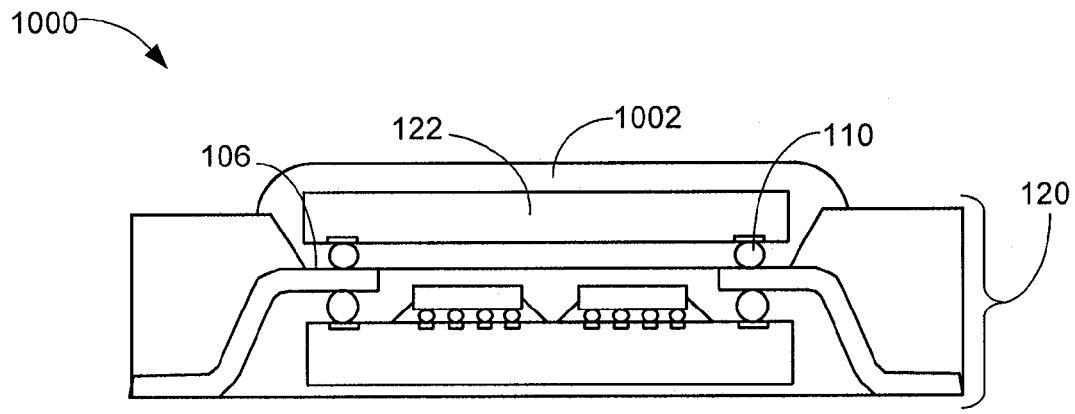
FIG. 10 is a cross-sectional view of an integrated circuit package system with integration port, in a seventh alternative embodiment of the present invention.

Referring now to FIG. 10, therein is shown a cross-sectional view of an integrated circuit package system 1000 with integration port, in a seventh alternative embodiment of the present invention. The cross-sectional view of the integrated circuit package system 1000 depicts the package base 120 with the third integrated circuit device 122, such as a ball grid array, a wafer level chip scale package, a system in package, a quad flat pack no-lead, a quad flat pack, a small outline package, packaged discrete components, or a flip chip integrated circuit, may be positioned over the package base 120 and coupled to the integration contacts 106 by the chip interconnect 110. An additional cover 1002 may be formed by molding, applying the underfill 116 of FIG. 1, applying a glob top sealant, or the like.

Figure 11:
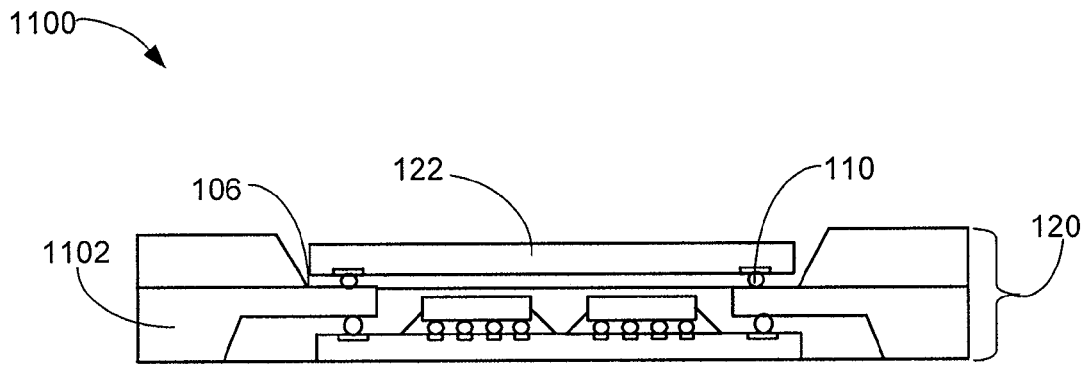
FIG. 11 is a cross-sectional view of an integrated circuit package system with integration port, in an eighth alternative embodiment of the present invention.

Referring now to FIG. 11, therein is shown a cross-sectional view of an integrated circuit package system 1100 with integration port, in an eighth alternative embodiment of the present invention. The cross-sectional view of the integrated circuit package system 1100 depicts the package base 120 having a lead frame 1102 that may be formed by pressing, coining, etching, or a combination thereof. The third integrated circuit device 122 may be positioned over the package base 120 and coupled to the integration contacts 106 by the chip interconnect 110.

Figure 12:
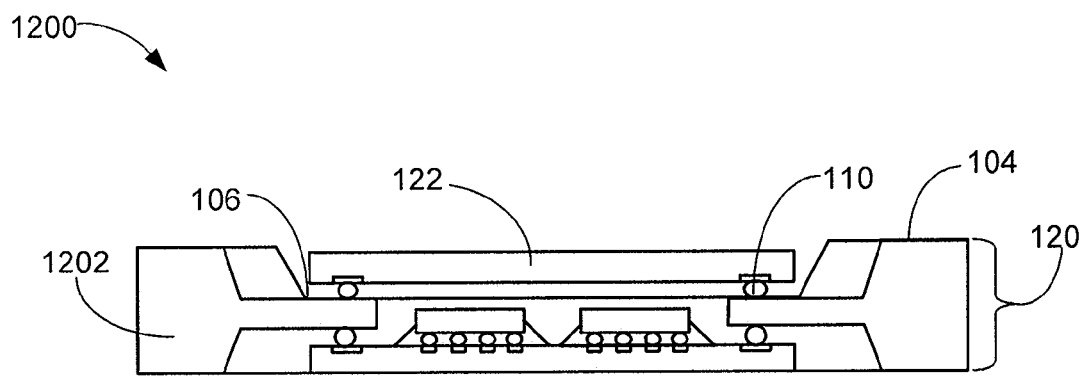
FIG. 12 is a cross-sectional view of an integrated circuit package system with integration port, in a ninth alternative embodiment of the present invention.

Referring now to FIG. 12, therein is shown a cross-sectional view of an integrated circuit package system 1200 with integration port, in a ninth alternative embodiment of the present invention. The cross-sectional view of the integrated circuit package system 1200 depicts the package base 120 having a lead frame 1202 that may be formed by pressing, coining, etching, or a combination thereof. The lead frame 1202 may provide the coplanar contacts 104 on the bottom and the top of the package base 120. The third integrated circuit device 122 may be positioned over the package base 120 and coupled to the integration contacts 106 by the chip interconnect 110.

Figure 13:
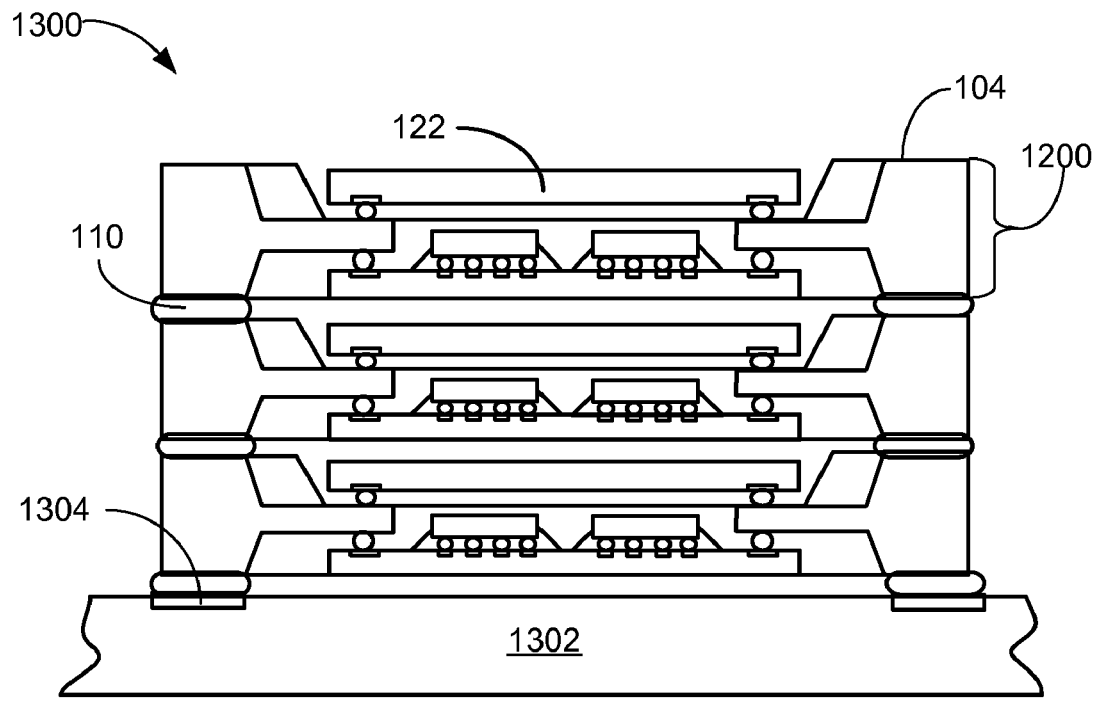
FIG. 13 is a cross-sectional view of a package stack, in an application of the package of FIG. 12.

Referring now to FIG. 13, therein is shown a cross-sectional view of a package stack 1300, in an application of the package of FIG. 12. The cross-sectional view of the package stack 1300 depicts a printed circuit board 1302 having contact pads 1304. The integrated circuit package system 1200 may be coupled to the contact pads 1304 by the chip interconnect 110. Additional units of the integrated circuit package system 1200 may be coupled to the coplanar contacts 104 of the initial installation of the integrated circuit package system 1200. This is by way of an example and a different number of the integrated circuit package system 1200 may be coupled over the printed circuit board 1302.

Figure 14:
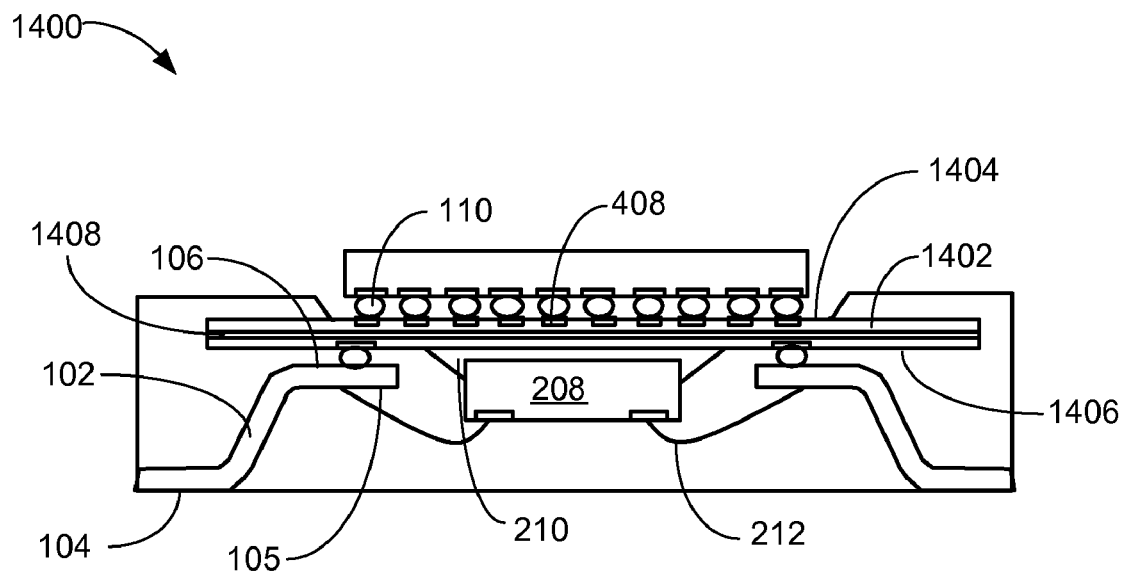
FIG. 14 is a cross-sectional view of an integrated circuit package system with integration port, in a tenth alternative embodiment of the present invention.

Referring now to FIG. 14, therein is shown a cross-sectional view of an integrated circuit package system 1400 with integration port, in a tenth alternative embodiment of the present invention. The cross-sectional view of the integrated circuit package system 1400 depicts the lead frame 102 having the coplanar contacts 104 and the integration contacts 106. An extended integration substrate 1402, such as a laminate printed circuit board, a ceramic substrate, or a redistribution layer, may be coupled to the integration contacts 106 by the chip interconnects 110. The extended integration substrate 1402 may have a substrate top 1404 and a substrate bottom 1406.

The integrated circuit die 208 may be mounted on the substrate bottom 1406 by the adhesive 210, such as a die attach material. The electrical interconnects 212, such as bond wires, may couple the integrated circuit die 208 to the bottom side 105 of the integration contacts 106.

The fourth integrated circuit device 414, such as a ball grid array, a quad flat pack, a small outline package, a quad flat pack no-lead, or the like, may be coupled to the extended integration contacts 408 by the chip interconnects 110. A substrate plane 1408, such as a ground plane or an electromagnetic induced noise shield, may isolate the fourth integrated circuit device 414 from the integrated circuit die 208.

Figure 15:
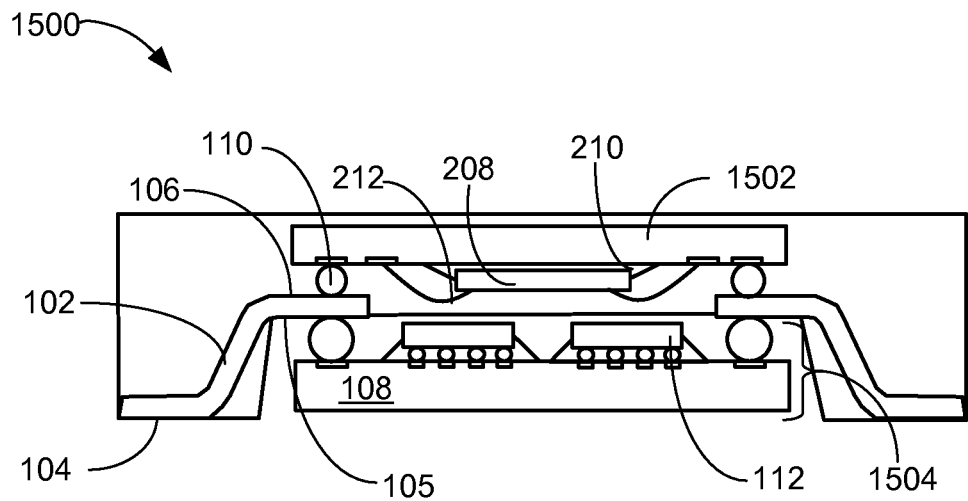
FIG. 15 is a cross-sectional view of an integrated circuit package system with integration port, in an eleventh alternative embodiment of the present invention.

Referring now to FIG. 15, therein is shown a cross-sectional view of an integrated circuit package system 1500 with integration port, in an eleventh alternative embodiment of the present invention. The cross-sectional view of the integrated circuit package system 1500 depicts the lead frame 102 having the coplanar contacts 104 and the integration contacts 106. A substrate 1502, such as a laminate printed circuit board, a ceramic substrate, or a redistribution layer, may be coupled to the integration contacts 106 by the chip interconnects 110. The integrated circuit die 208 may be mounted on the substrate 1502 by the adhesive 210, such as a die attach material. The electrical interconnects 212, such as bond wires, may couple the integrated circuit die 208 to the distribution contacts 214 of the substrate 1502.

The enclosure 118 may be formed on the lead frame 102, the substrate 1502, the integrated circuit die 208, the electrical interconnects 212, and the chip interconnects 110. The bottom side 105 of the integration contacts 106 remains exposed by a recess formed beneath the bottom side 105. An expansion assembly 1504 may include the first integrated circuit device 108 having at least two of the second integrated circuit device 112 mounted thereon. The expansion assembly 1504 may be coupled to the bottom side 105 of the integration contacts 106 by the chip interconnect 110.

Figure 16:
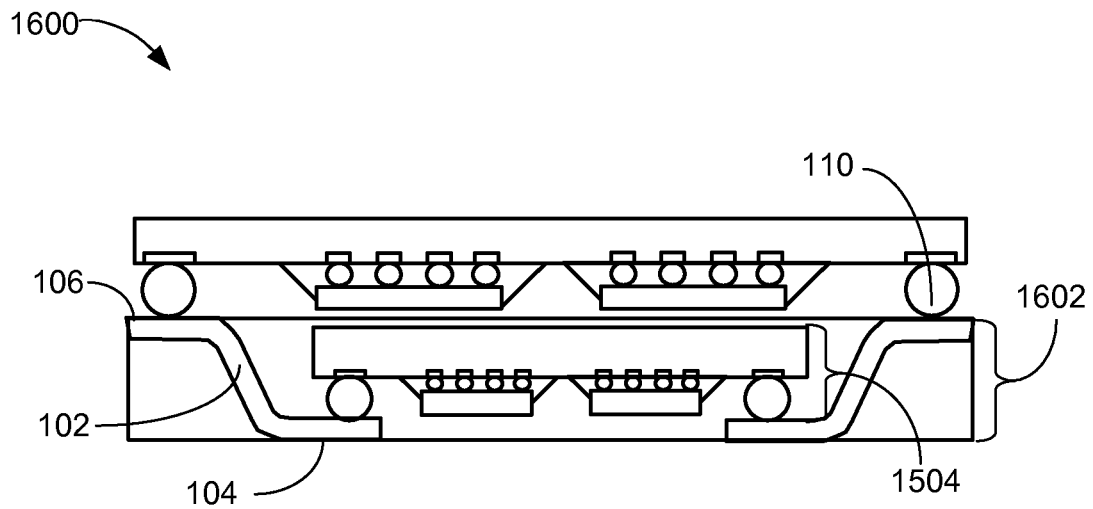
FIG. 16 is a cross-sectional view of an integrated circuit package system with integration port, in a twelfth alternative embodiment of the present invention.

Referring now to FIG. 16, therein is shown a cross-sectional view of an integrated circuit package system 1600 with integration port, in a twelfth alternative embodiment of the present invention. The cross-sectional view of the integrated circuit package system 1600 depicts the lead frame 102 having the coplanar contacts 104 and the integration contacts 106. The integration contacts 106 may be formed outboard of the coplanar contacts 104.

The expansion assembly 1504 may be inverted and mounted over the coplanar contacts 104 by the chip interconnect 110. A package base 1602 may be formed the enclosure 118 formed, on the expansion assembly 1504, leaving the coplanar contacts 104 and the integration contacts 106 exposed. An additional unit of the expansion assembly 1504 may be coupled to the integration contacts 106 by the chip interconnects 110.

Figure 17:
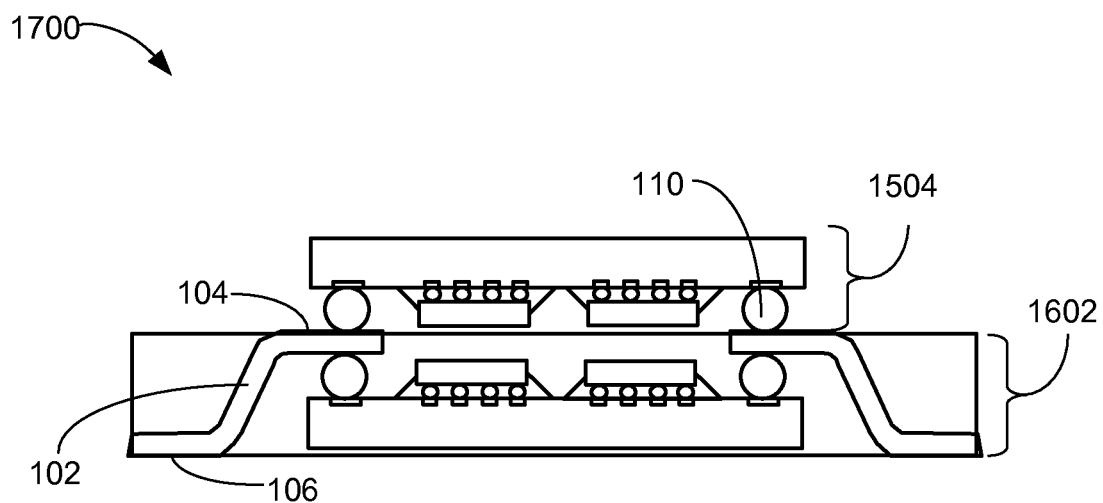
FIG. 17 is a cross-sectional view of an integrated circuit package system with integration port, in a thirteenth alternative embodiment of the present invention.

Referring now to FIG. 17, therein is shown a cross-sectional view of an integrated circuit package system 1700 with integration port, in a thirteenth alternative embodiment of the present invention. The cross-sectional view of the integrated circuit package system 1700 depicts the package base 1602 in an inverted position with the expansion assembly 1504 coupled to the coplanar contacts 104.

The integration contacts 106 are then available for connection to the next level system (not shown). Since the integration contacts 106 are coplanar with each other, there is effectively no restriction on which contacts are used to connect the next level system.

Figure 18:
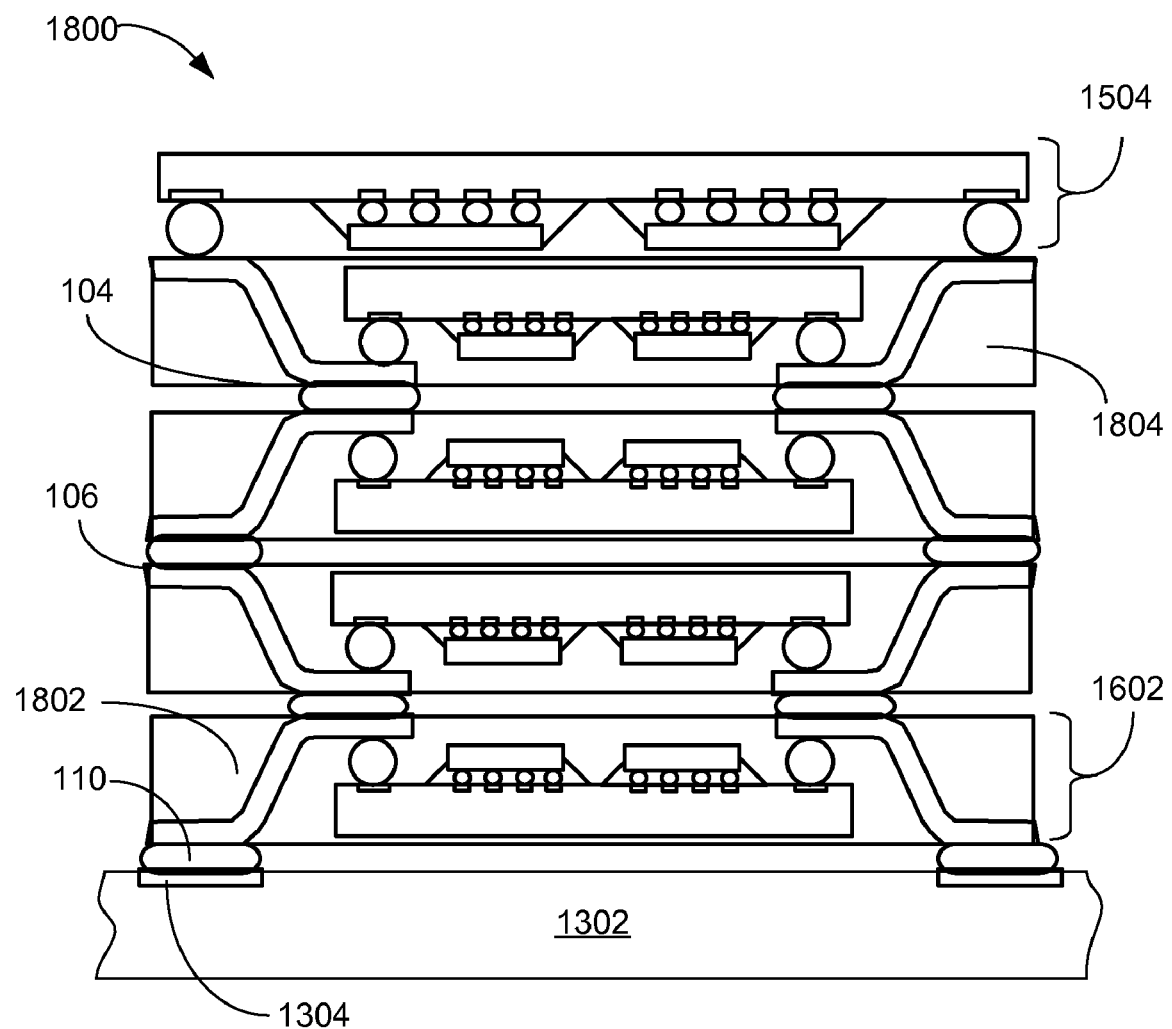
FIG. 18 is a cross-sectional view of a package stack, in an application of the package base of FIG. 16.

Referring now to FIG. 18, therein is shown a cross-sectional view of a package stack 1800, in an application of the package base 1602 of FIG. 16. The cross-sectional view of the package stack 1800 depicts the printed circuit board 1302 having the contact pads 1304. A first package base 1802, comprising the package base 1602, may be coupled to the contact pads 1304 by the chip interconnect 110.

A second package base 1804, comprising an additional unit of the package base 1602, may be coupled to the initial unit of the package base 1602 by inverting it and electrically connecting the coplanar contacts 104 by the chip interconnect 110. In the next additional unit the integration contacts 106 may be used to join the package base 1602. At the top of the package stack 1800 the expansion assembly 1504 may be coupled to the integration contacts 106 by the chip interconnect 110. This is an example only and any number of the package base 1602 may be incorporated in the package stack 1800.

Figure 19:
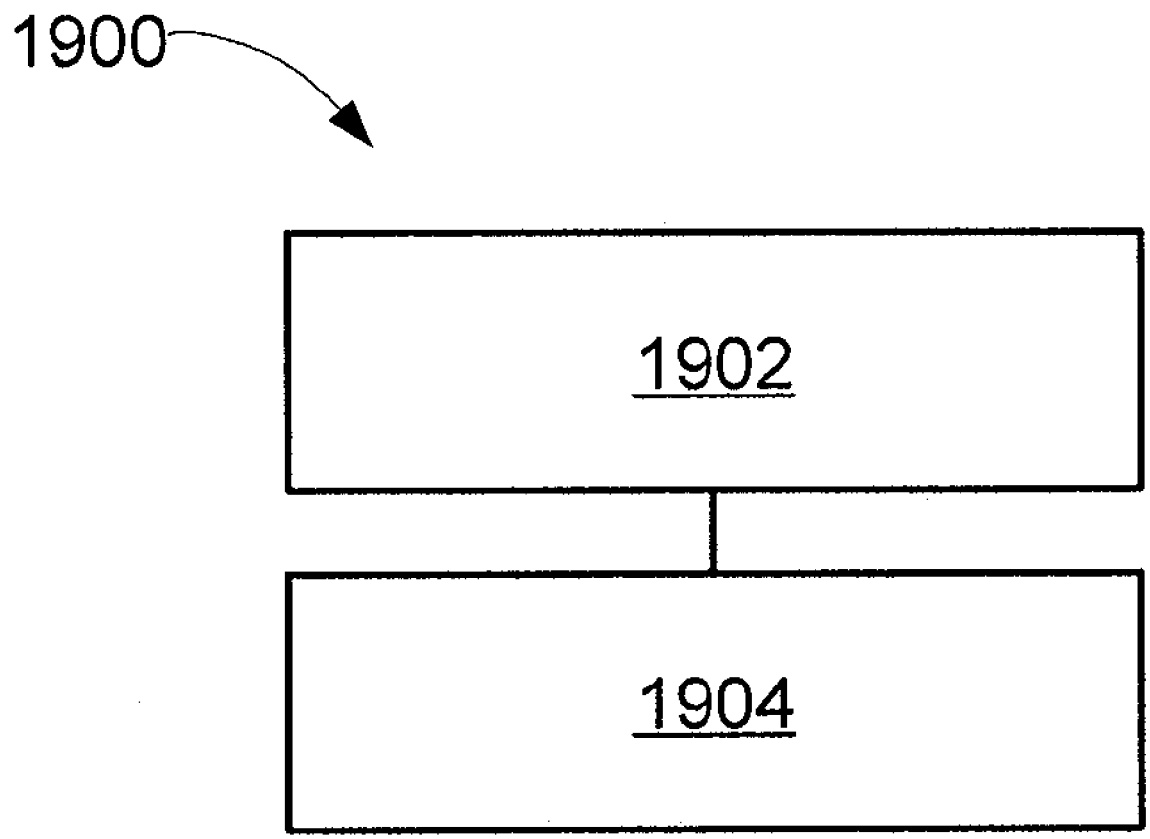
FIG. 19 is a flow chart of an integrated circuit package system for utilizing the integrated circuit package system with integration port, in an embodiment of the present invention.

Referring now to FIG. 19, therein is shown a flow chart of an integrated circuit package system 1900 for manufacturing the integrated circuit package system 100 with integration port in an embodiment of the present invention. The system 1900 includes fabricating a package base including: forming a lead frame, coupling a first integrated circuit device under the lead frame, coupling a second integrated circuit device over the first integrated circuit device, and molding an enclosure on the lead frame, the first integrated circuit device, and the second integrated circuit device for forming an integration port in a block 1902; and coupling a third integrated circuit device on the integration port in a block 1904.

It has been discovered that the present invention thus has numerous aspects.

A principle aspect that has been unexpectedly discovered is that the present invention is that it may flexibly allow any type of package, integrated circuit die, discrete component, or combination thereof to be assembled in a stacked configuration with a multi-device package base.

Another aspect is that all of the sub-components of the integrated circuit package system with integration port may be fully tested prior to assembly of the final device yielding a dramatic increase in manufacturing yield.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with integration port of the present invention furnishes important and heretofore unknown and unavailable solutions, capabilities, and functional aspects for producing mixed technology system in package devices. The resulting processes and configurations are straightforward, cost-effective, uncomplicated, highly versatile and effective, can be surprisingly and unobviously implemented by adapting known technologies, and are thus readily suited for efficiently and economically manufacturing mixed technology system in package devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
  fabricating a package base including:
    forming a lead frame,
    coupling a first integrated circuit device under the lead frame,
    coupling an extended integration substrate, having a substrate bottom, to the lead frame with a chip interconnect, the chip interconnect vertically extended between the extended integration substrate and the lead frame,
    attaching a side of a second integrated circuit device to the substrate bottom with an adhesive, the adhesive fully covering the side, and
    molding an enclosure on the lead frame, the extended integration substrate, the first integrated circuit device, and the second integrated circuit device for forming an integration port, the integration port fully above the lead frame and exposed from the enclosure; and
  coupling a third integrated circuit device on the integration port.

2. The method as claimed in claim 1 wherein coupling the extended integration substrate to the lead frame includes the extended integration substrate is a redistribution layer.

3. The method as claimed in claim 1 wherein coupling the first integrated circuit device under the lead frame includes:
  forming the extended integration substrate;
  coupling an integrated circuit die, a discrete component, the second integrated circuit device, or a combination thereof under the extended integration substrate; and
  forming an extended integration port by molding the enclosure with an extended integration recess.

4. The method as claimed in claim 1 further comprising forming a package stack including:
  fabricating a printed circuit board;
  coupling a first package base to the printed circuit board; and
  coupling a second package base having the third integrated circuit device mounted thereon over the first package base.

5. The method as claimed in claim 1 wherein fabricating the package base includes:
  fabricating a substrate;
  coupling an integrated circuit die, a discrete component, the second integrated circuit device, or a combination thereof on the substrate;
  coupling the substrate under the lead frame; and
  molding the enclosure having the substrate, the integrated circuit die, the discrete component, the second integrated circuit device, or the combination under the integration port.

6. A method of manufacture of an integrated circuit package system comprising:
  fabricating a package base including:
    forming a lead frame having coplanar contacts and integration contacts,
    coupling a first integrated circuit device under the lead frame including coupling a chip interconnect between the lead frame and the first integrated circuit device,
    coupling an extended integration substrate. having a substrate bottom, to the lead frame with the chip interconnect, the chip interconnect vertically extended between the extended integration substrate and the lead frame,
    attaching a side of a second integrated circuit device to the substrate bottom with an adhesive, the adhesive fully covering the side, and
    molding an enclosure on the lead frame, the extended integration substrate, the first integrated circuit device, and the second integrated circuit device for forming an integration port including exposing the integration contacts, the integration port fully above the lead frame and exposed from the enclosure; and
  coupling a third integrated circuit device with the chip interconnect on the integration port including coupling a ball grid array, a wafer level chip scale package, a quad flat pack, a small outline package, a flip chip integrated circuit, or discrete components.

7. The method as claimed in claim 6 wherein coupling the extended integration substrate to the lead frame includes providing extended integration contacts on the extended integration substrate mounted over the integration contacts, under the integration contacts, or a combination thereof.

8. The method as claimed in claim 6 wherein coupling the first integrated circuit device under the lead frame includes:
  forming the extended integration substrate having distribution contacts, extended integration contacts, or a combination thereof;
  coupling an integrated circuit die, a discrete component, the second integrated circuit device, or a combination thereof under the extended integration substrate including coupling an electrical interconnect, the chip interconnect, or a combination thereof; and
  forming an extended integration port by molding the enclosure with an extended integration recess including coupling a fourth integrated circuit device to the extended integration port.

9. The method as claimed in claim 6 further comprising forming a package stack including:
  fabricating a printed circuit board including providing contact pads;
  coupling a first package base to the printed circuit board; and
  coupling a second package base having the third integrated circuit device mounted thereon over the first package base including coupling an expansion assembly over the second package base.

10. The method as claimed in claim 6 wherein fabricating the package base includes:
  fabricating a substrate having distribution contacts;
  coupling an integrated circuit die, the discrete components, the second integrated circuit device, or a combination thereof on the substrate including providing a substrate top and a substrate bottom;
  coupling the substrate under the lead frame including providing a bottom side of the integration contact for coupling the substrate; and
  molding the enclosure having the substrate, the integrated circuit die, the discrete component, the second integrated circuit device, or the combination under the integration port including providing an extended integration recess.

11. An integrated circuit package system comprising:
  a package base including:
    a lead frame,
    a first integrated circuit device under the lead frame,
    an extended integration substrate, having a substrate bottom, coupled to the lead frame by a chip interconnect, the chip interconnect vertically extended between the extended integration substrate and the lead frame, a side of a second integrated circuit device attached to the substrate bottom with an adhesive, the adhesive fully covering the side, and an enclosure molded on the lead frame, the extended integration substrate, the first integrated circuit device, and the second integrated circuit device for forming an integration port, the integration port fully above the lead frame and exposed from the enclosure; and a third integrated circuit device on the integration port.

12. The system as claimed in claim 11 wherein the extended integration substrate is a redistribution layer.

13. The system as claimed in claim 11 wherein the first integrated circuit device under the lead frame includes:

an integrated circuit die, a discrete component, the second integrated circuit device, or a combination thereof under the extended integration substrate; and an extended integration port formed in the enclosure with an extended integration recess.

14. The system as claimed in claim 11 further comprising a package stack including:

a printed circuit board;

a first package base coupled to the printed circuit board; and a second package base with the third integrated circuit device mounted thereon over the first package base.

15. The system as claimed in claim 11 wherein the package base includes:

a substrate;

an integrated circuit die, a discrete component, the second integrated circuit device, or a combination thereof on the substrate;

the substrate under the lead frame; and the enclosure with the substrate, the integrated circuit die, the discrete component, the second integrated circuit device, or the combination under the integration port.

16. The system as claimed in claim 11 wherein the chip interconnect is between the lead frame and the first integrated circuit device; and further comprising:

coplanar contacts and integration contacts on the lead frame;

an interface pad on the first integrated circuit device;

an integration contact exposed by the enclosure; and a ball grid array, a wafer level chip scale package, a quad flat pack, a small outline package, a flip chip integrated circuit, or discrete components on the integration port.

17. The system as claimed in claim 16 wherein the extended integration substrate on the lead frame includes extended integration contacts on the extended integration substrate mounted over the integration contacts, under the integration contacts, or a combination thereof.

18. The system as claimed in claim 16 wherein the first integrated circuit device under the lead frame includes:

distribution contacts, extended integration contacts, or a combination thereof on the extended integration substrate;

an integrated circuit die, a discrete component, the second integrated circuit device, or a combination thereof under the extended integration substrate includes an electrical interconnect, the chip interconnect, or a combination thereof coupled to the extended integration substrate; and an extended integration port formed in the enclosure with an extended integration recess includes a fourth integrated circuit device coupled to the extended integration port.

19. The system as claimed in claim 16 further comprising a package stack including:

a printed circuit board includes contact pads;

a first package base coupled to the printed circuit board; and a second package base with the third integrated circuit device mounted thereon over the first package base includes an expansion assembly over the second package base.

20. The system as claimed in claim 16 wherein the package base includes:

a substrate with distribution contacts;

an integrated circuit die, the discrete components, the second integrated circuit device, or a combination thereof on the substrate includes a substrate top and a substrate bottom;

the substrate under the lead frame includes a bottom side of the integration contact coupled to the substrate; and the enclosure molded with the substrate, the integrated circuit die, the discrete component, the second integrated circuit device, or the combination under the integration port includes an extended integration recess.

* * * * *

UNITED STATES PATENT AND TRADEMARK OFFICE
CERTIFICATE OF CORRECTION

| | | |
|---|---|---|
| PATENT NO. | : 8,273,602 B2 | Page 1 of 1 |
| APPLICATION NO. | : 12/046430 | |
| DATED | : September 25, 2012 | |
| INVENTOR(S) | : Bathan et al. | |

It is certified that error appears in the above-identified patent and that said Letters Patent is hereby corrected as shown below:

In the Claims:

Column 11, claim 6, lines 61-67, delete:
"coupling a first integrated circuit device under the lead frame including coupling a chip interconnect between the lead frame and the first integrated circuit device, coupling an extended integration substrate. having a substrate bottom, to the lead frame with the chip interconnect, the chip interconnect vertically extended between the extended integration substrate and the lead frame,"

and insert therefor,
--coupling a first integrated circuit device under the lead frame including coupling a chip interconnect between the lead frame and the first integrated circuit device, coupling an extended integration substrate, having a substrate bottom, to the lead frame with the chip interconnect, the chip interconnect vertically extended between the extended integration substrate and the lead frame,--

Signed and Sealed this
Eleventh Day of March, 2014

Michelle K. Lee
*Deputy Director of the United States Patent and Trademark Office*